United States Patent
Furuta

(10) Patent No.: US 8,029,171 B2
(45) Date of Patent: Oct. 4, 2011

(54) FIXING STRUCTURE OF LIGHT EMITTING DIODE AND ELECTRONIC APPARATUS

(75) Inventor: Norimichi Furuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 251 days.

(21) Appl. No.: 12/453,315

(22) Filed: May 6, 2009

(65) Prior Publication Data

US 2009/0219729 A1  Sep. 3, 2009

(51) Int. Cl.
*F21V 21/00* (2006.01)
(52) U.S. Cl. .................. 362/396; 362/382; 362/800
(58) Field of Classification Search .......... 362/382, 362/396, 800
See application file for complete search history.

(56) References Cited

U.S. PATENT DOCUMENTS 4,419,722 A * 12/1983 Bury ............................. 362/396
4,507,718 A   3/1985 Bury

FOREIGN PATENT DOCUMENTS

| JP | 60-16570 | 2/1985 |
|----|----------|--------|
| JP | 60-208871 | 10/1985 |
| JP | 1-156588 | 10/1989 |
| JP | 2-129972 | 5/1990 |
| JP | 2003-51619 | 2/2003 |
| JP | 3116738 | 11/2005 |

OTHER PUBLICATIONS

International Search Report for International Application PCT/JP2007/053196, mailed Mar. 20, 2007.

* cited by examiner

*Primary Examiner* — Diane Lee
*Assistant Examiner* — Sean Gramling
(74) *Attorney, Agent, or Firm* — Fujitsu Patent Center

(57) ABSTRACT

A fixing structure of a light emitting diode includes an opening part formed in the fixing plate, the opening part being where the light emitting diode is inserted and extending in a fixing direction perpendicular to an inserting direction; a first engaging part configured to engage one of a surface and a rear surface of the brim part in a state where the light emitting diode is fixed; a second engaging part configured to engage another one of the surface and the rear surface of the brim part in the state where the light emitting diode is fixed; and a third engaging part configured to engage the light emitting part of the light emitting diode in the state where the light emitting diode is fixed so that detachment of the light emitting diode in a direction opposite to the fixing direction is prevented.

15 Claims, 8 Drawing Sheets though the diodes have been widely used for display parts or the like of electronic apparatuses. In addition, various kinds of external configurations of the light emitting diodes such as a cannonball type, a chip type, or a multi-segment type have been suggested. As the display part of the above-mentioned electronic apparatuses, the cannonball type light emitting diode has been widely used because the cannonball type light emitting diode can be easily handled and the manufacturing cost of the cannonball type light emitting diode is low.

FIXING STRUCTURE OF LIGHT EMITTING DIODE AND ELECTRONIC APPARATUS

CROSS-REFERENCE TO RELATED APPLICATIONS

This patent application is based upon and claims the benefit of priority under 35 USC 120 and 365(c) of PCT application JP2007/53196 filed in Japan on Feb. 21, 2007, the entire contents of which are incorporated herein by reference.

FIELD

The embodiments discussed herein are related to fixing structures of light emitting diodes and electronic apparatuses.

BACKGROUND

Since, normally, consumption of electric power by light emitting diodes is low and various kinds of light emitting colors have been provided, the light emitting diodes have been widely used for display parts or the like of electronic apparatuses. In addition, various kinds of external configurations of the light emitting diodes such as a cannonball type, a chip type, or a multi-segment type have been suggested. As the display part of the above-mentioned electronic apparatuses, the cannonball type light emitting diode has been widely used because the cannonball type light emitting diode can be easily handled and the manufacturing cost of the cannonball type light emitting diode is low.

FIG. 1 and FIG. 2 illustrate an example of a cannonball type light emitting diode. A cannonball type light emitting diode 1 includes a light emitting part 2, a brim part 3, leads 4 and others.

The light emitting part 2 is formed by sealing a light emitting diode element with resin. The light emitting diode 1 emits light by the light emitting part 2. The light emitting part 2 has a cylindrical-shaped configuration having a spherical-shaped end.

In addition, the diameter of the brim part 3 is larger than that of the light emitting part 2. Therefore, a step part is formed between the light emitting part 2 and the brim part 3. In addition, the leads 4 extend from a rear surface side of the brim part 3. The leads 4 are connected to a light emitting diode element. In the following description, a step surface formed between the light emitting part 2 and the brim part 3 is called a surface 3a and a surface where the leads 4 extend is called a rear surface 3b.

There are two methods for fixing the light emitting diode 1 to an electronic apparatus. One is a method where the light emitting diode 1 is provided on a circuit board and then the circuit board is fixed to a housing of the electronic apparatus. The other one is a method discussed at Japanese Laid-Open Patent Application Publication No. 2-129972 where the light emitting diode 1 is directly fixed to the housing of the electronic apparatus. Light coming from the light emitting diode 1 has a high directivity. Therefore, if the light emitting diode fixed on the circuit board has a positional shift such as an inclination, it may not be possible to properly display due to lack of brightness.

In the method where the light emitting diode 1 is provided on the circuit board and then the circuit board is fixed to the housing of the electronic apparatus, manufacturing error may occur both when the light emitting diode 1 is provided on the circuit board and when the circuit board is fixed to the housing. Accordingly, it is general practice to use the method where the light emitting diode 1 is directly fixed to the housing of the electronic apparatus as the method for fixing the light emitting diode 1.

FIG. 3 through FIG. 5 illustrate a structure of a first related art example where the light emitting diode 1 is directly fixed to a housing 10A of an electronic apparatus. In this fixing structure of the first related art example, the light emitting diode is fixed to the housing 10A by using a bushing 20.

An inserting hole 11 is formed in the housing 10A. The bushing 20 is inserted in the inserting hole 11. The bush 20 includes, as illustrated in FIG. 5, a ring-shaped base part 21, projection parts 22 and arm parts 23 extending from the base part 21 in the direction indicated by an arrow X2, and an inserting hole part 25 formed inside the projection parts 22 and the arm parts 23. In addition, claw parts 24 projecting toward the inside are formed at end parts of the arm parts 23.

In order to fix the light emitting diode 1 to the housing 10A, first, the bushing 20 is inserted in the inserting hole 11 in the direction indicated by the arrow X2 from the surface side of the housing 10A. Then, the light emitting diode 1 is inserted from the rear surface side of the housing 10A into the inserting hole part 25 in the direction indicated by an arrow X1. As a result of this, the light emitting diode 1 enters in the direction indicated by the arrow X1 while the light emitting diode 1 pushes and extends the claw parts 24 (the brim parts 23). When the brim parts 23 get over the claw parts 24, the brim parts 23 are sandwiched between the projection parts 22 and the claw parts 24 so that the light emitting diode 1 is fixed to the housing 10A. At this time, the light emitting part 2 is supported by an internal wall of the inserting hole part 25.

FIG. 6 through FIG. 8 illustrate a structure of a second related art example where the light emitting diode 1 is directly fixed to a housing 10B of an electronic apparatus. In the fixing structure of the second related art example, the light emitting diode 1 is fixed to the housing 10B without using the bushing 20.

A columnar-shaped part 12 is formed at a rear surface side of the housing 10B so as to extend in upper and lower directions. An inserting hole 11 is formed so as to match the columnar-shaped part 12. In addition, arm parts 14 are formed so as to extend from both side parts of the inserting hole 11 in the direction indicated by an arrow X2. Claw parts 15 are formed at head end parts of the arm parts 14.

In order to fix the light emitting diode 1 to the housing 10B, the light emitting diode 1 is inserted from the rear surface side of the housing 10B into the inserting hole 11 in the direction indicated by an arrow X1. As a result of this, the light emitting diode 1 enters in the direction indicated by the arrow X1 while the light emitting diode 1 pushes and extends the claw parts 15 (the arm parts 14). When the brim parts 3 get over the claw parts 15, the brim parts 3 are sandwiched between the columnar-shaped parts 12 (edge parts 12a relative to the inserting hole 11) and the claw parts 15 so that the light emitting diode 1 is fixed to the housing 10B. At this time, the light emitting part 2 is supported by a supporting part 13 of the columnar-shaped parts 12.

However, in the structures of the first and the second related art examples where the light emitting diode 1 is inserted in directions perpendicular to the housings 10A and 10B, namely in the direction indicated by the arrow X1, and fixed, the arms parts 14 and 23 are long and therefore are low-strength.

Because of this, in the case where the claw parts 15 and 24 are pushed and extended so that the arm parts 14 and 23 are deformed and thereby the light emitting diode 1 is fixed to the housing 10A or 10B, the bases of the arm parts 14 and 23 (parts indicated by an arrow A in FIG. 5 and FIG. 8) are degraded so that they may be damaged (broken). If the arm parts 14 and 23 are degraded or damaged (broken) when the light emitting diode 1 is fixed, the light emitting diode 1 may be detached from the housing 10A or 10B by low impact at the time of transportation.

Furthermore, in a case where the light emitting diode 1 malfunctions so that it should be exchanged, loads are applied to the arm part 14 or 23 again at the time of exchange. Because of this, the arm parts 14 and 23 may be degraded or damaged (broken). It may be necessary to exchange the bushing 20 and housing 10B simultaneously with the light emitting diode 1.

In addition, in the fixing structure of the first related art example, it is necessary to provide the bushing 20 separately from the housing 10A. Therefore, the number of components is increased so that the manufacturing cost of the components is increased.

SUMMARY

According to an aspect of the invention, it is possible to provide a fixing structure of a light emitting diode where the light emitting diode is fixed to a fixing plate, the light emitting diode including a light emitting part and a brim part provided at an end part of the light emitting part and having a cannonball-shaped configuration, the fixing structure including an opening part formed in the fixing plate, the opening part being where the light emitting diode is inserted and extending in a fixing direction perpendicular to an inserting direction; a first engaging part configured to engage one of a surface and a rear surface of the brim part in a state where the light emitting diode is fixed; a second engaging part configured to engage another one of the surface and the rear surface of the brim part in the state where the light emitting diode is fixed; and a third engaging part configured to engage the light emitting part of the light emitting diode in the state where the light emitting diode is fixed so that detachment of the light emitting diode in a direction opposite to the fixing direction is prevented, wherein, in a case where the light emitting diode is being fixed in a fixing position engaging the first through third engaging parts, the fixing plate is elastically deformed so that an entry of the light emitting diode into the fixing position is permitted.

According to another aspect of the invention, it is possible to provide an electronic apparatus having a fixing structure where a light emitting diode is fixed to a fixing plate, the light emitting diode including a light emitting part and a brim part provided at an end part of the light emitting part and having a cannonball-shaped configuration, the fixing structure, including: an opening part formed in the fixing plate, the opening part being where the light emitting diode is inserted and extending in a fixing direction perpendicular to an inserting direction; a first engaging part configured to engage one of a surface and a rear surface of the brim part in a state where the light emitting diode is fixed; a second engaging part configured to engage another one of the surface and the rear surface of the brim part in the state where the light emitting diode is fixed; and a third engaging part configured to engage the light emitting part of the light emitting diode in the state where the light emitting diode is fixed so that detachment of the light emitting diode in a direction opposite to the fixing direction is prevented, wherein, in a case where the light emitting diode is being fixed in a fixing position engaging the first through third engaging parts, the fixing plate is elastically deformed so that an entry of the light emitting diode into the fixing position is permitted.

Additional objects and advantages of the embodiments are set forth in part in the description which follows, and in part will become obvious from the description, or may be learned by practice of the invention.

The object and advantages of the invention may be realized and attained by means of the elements and combinations particularly pointed out in the appended claims.

It is to be understood that both the foregoing general description and the following detailed description are exemplary and explanatory and are not restrictive of the invention as claimed.

DETAILED DESCRIPTION OF THE PREFERRED EMBODIMENTS

Preferred embodiments of the present invention will be explained with reference to accompanying drawings.

The embodiments of the present invention may provide a novel and useful fixing structure of a light emitting diode and an electronic apparatus solving one or more of the problems discussed above.

More specifically, the embodiments of the present invention may provide a fixing structure of a light emitting diode and an electronic apparatus wherein damage or the like of first through third connecting parts at a fixing time when the light emitting diode is fixed to a fixing plate is prevented, so that reliability of a fixing structure is improved and increase of the number of components is prevented.

Figure 1:
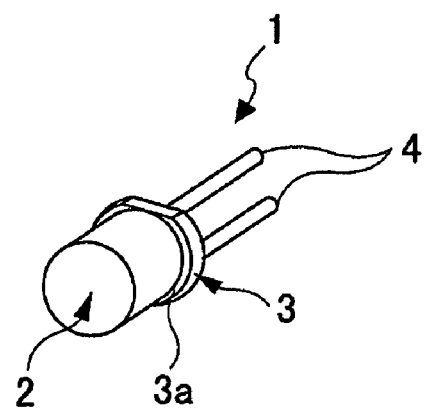
FIG. 1 is a perspective front view of a cannonball type light emitting diode.
Figure 2:
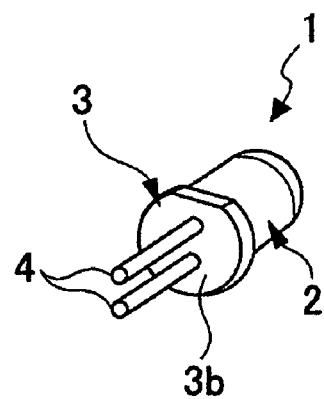
FIG. 2 is a perspective rear view of a cannonball type light emitting diode.
Figure 3:
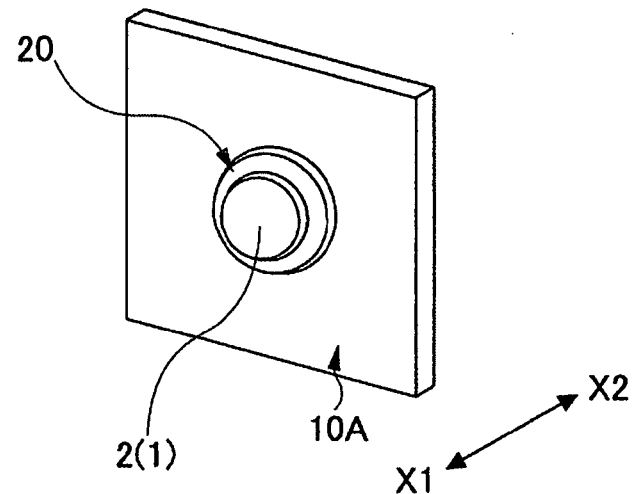
FIG. 3 is a view for explaining a fixing structure of a first related art example where a light emitting diode is fixed to a housing and a perspective front view of the housing where the light emitting diode is fixed.
Figure 4:
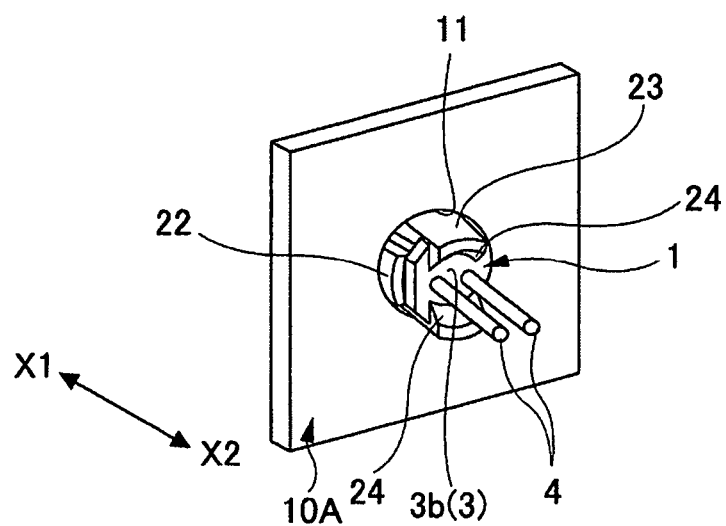
FIG. 4 is a view for explaining the fixing structure of the first related art example where the light emitting diode is fixed to the housing and a perspective rear view of the housing where the light emitting diode is fixed.
Figure 5:
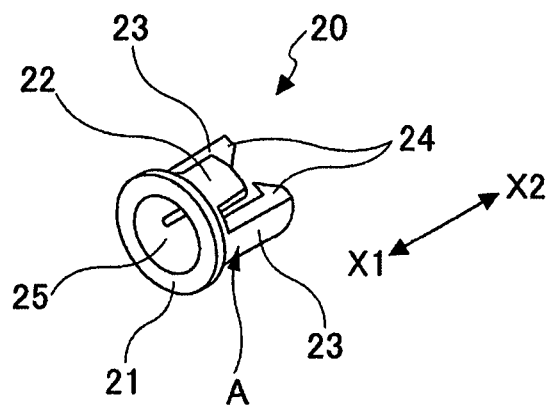
FIG. 5 is a view for explaining the fixing structure where the light emitting diode of the first related art example is fixed to the housing and a perspective view of a bushing used for fixing the light emitting diode.
Figure 6:
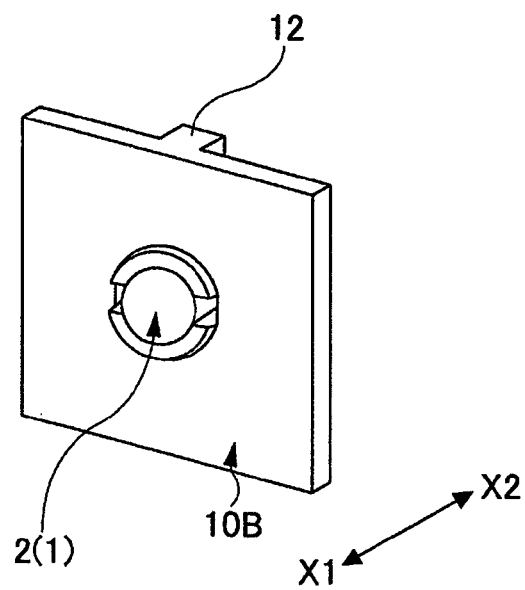
FIG. 6 is a view for explaining a fixing structure where a light emitting diode of a second related art example is fixed to a housing and a perspective front view of the housing where the light emitting diode is fixed.
Figure 7:
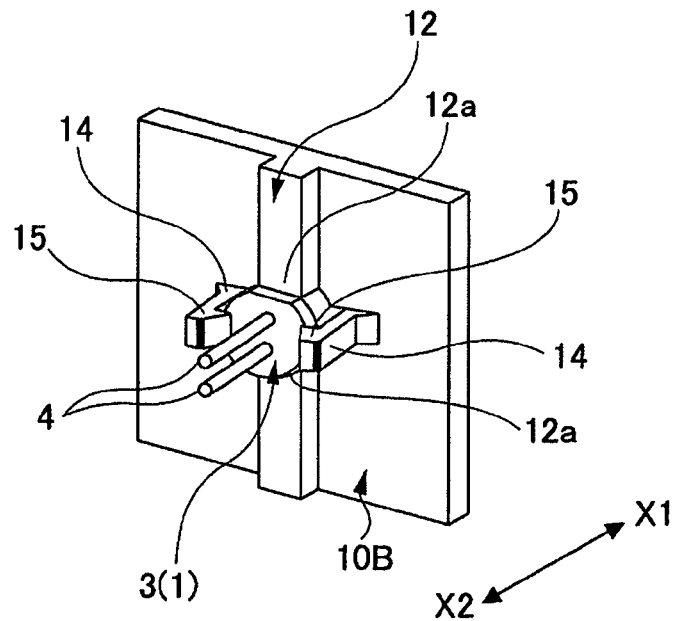
FIG. 7 is a view for explaining the fixing structure of the second related art example where the light emitting diode is fixed to the housing and a perspective rear view of the housing where the light emitting diode is fixed.
Figure 8:
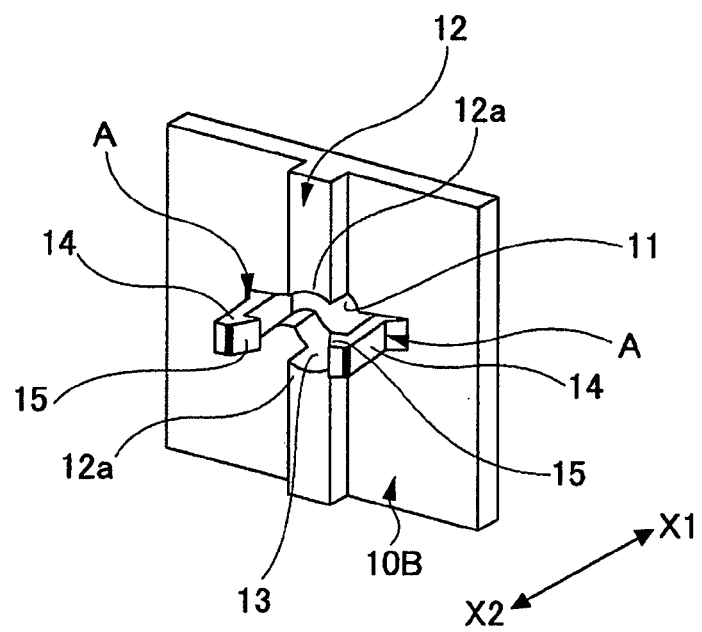
FIG. 8 is a view for explaining the fixing structure of the second related art example where the light emitting diode is fixed to the housing and a perspective front view of the housing.
Figure 9:
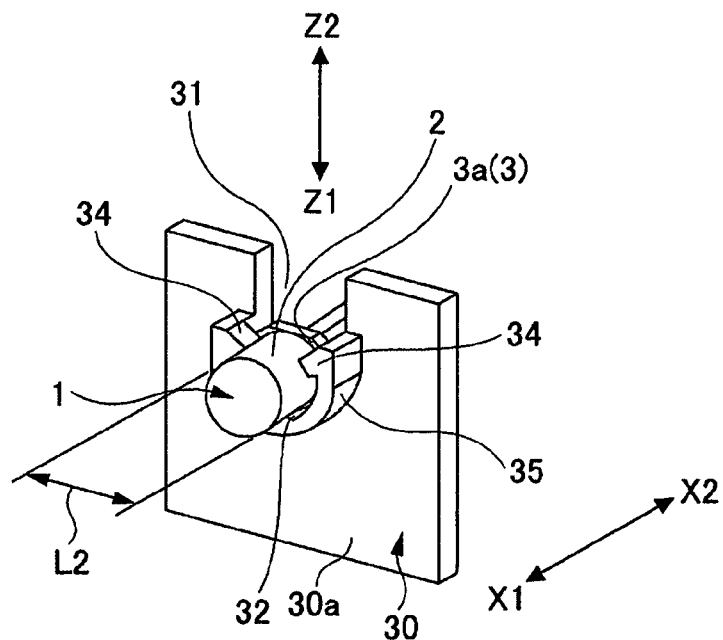
FIG. 9 is a view for explaining a fixing structure of an embodiment where a light emitting diode is fixed to a housing and a perspective front view of the housing where the light emitting diode is fixed.
Figure 10:
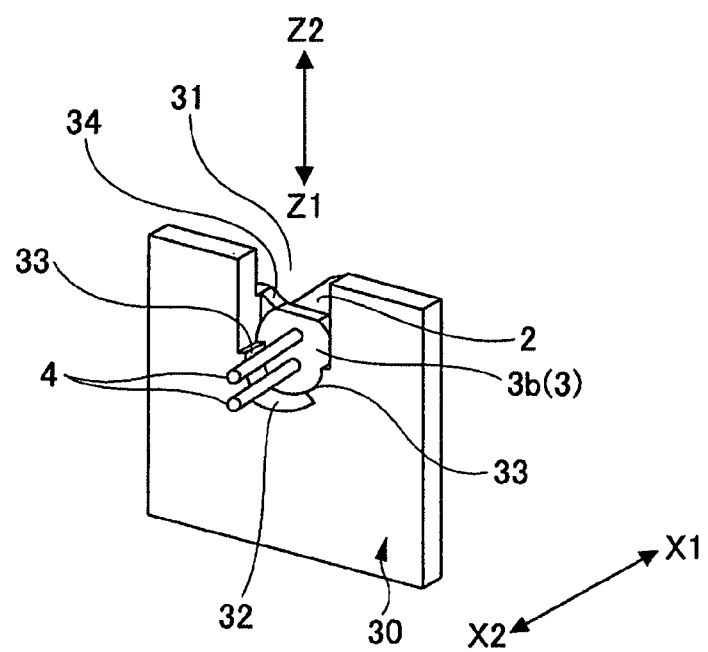
FIG. 10 is a view for explaining the fixing structure of the embodiment where the light emitting diode is fixed to the housing and a perspective rear view of the housing where the light emitting diode is fixed.

FIG. 9 through FIG. 14 are views for explaining a fixing structure of a light emitting diode of the embodiment. FIG. 9 and FIG. 10 illustrate a state where a light emitting diode 1 is fixed to a housing 30 as a fixing plate. FIG. 11 through FIG. 14 illustrate the housing 30 where the light emitting diode 1 is removed.

The housing 30 is, for example, a housing of an electronic apparatus. In the embodiment, the light emitting diode 1 is directly fixed to the housing 30. The light emitting diode 1 is configured to form various kinds of displays of the electronic apparatus. In each of FIG. 9 through FIG. 14, for the convenience of illustration and explanation, only a position in the vicinity of the housing 30 where the light emitting diode 1 is fixed is illustrated in an expanded manner.

The housing 30 is made by molding an elastically deformable resin material. A U-shaped part 35 is formed on a surface 30a of the housing 30 so as to extend. In addition, an opening part 31 is formed in the housing 30. The opening part 31 extends in a direction indicated by an arrow Z1 and has a substantially U-shaped configuration. A curved configuration of a lower end part 31a of the opening part 31 is substantially the same as the configuration of a lower end part of the U-shaped part 35.

The width of the opening part 31 is equal to or slightly greater than the diameter of a brim part 3 forming a part of the light emitting diode 1. In addition, the radius of the lower end part 31a (an end part in the direction indicated by the arrow Z1 in FIG. 13) of the opening part 31 is equal to or slightly greater than the radius of the brim part 3 forming a part of the light emitting diode 1. Accordingly, the brim part 3 of the light emitting diode 1 can be inserted inside the opening part 31.

As discussed below, the light emitting diode 1 is fixed inside the opening part 31 formed in the housing 30. The light emitting diode 1 is inserted in a direction perpendicular to the housing 30 against the opening part 31, namely an inserting direction indicated by an arrow X1. Then, by moving the light emitting diode 1 in a direction perpendicular to the inserting direction X1, namely in a fixing direction indicated by an arrow Z1, the light emitting diode 1 is fixed to the housing 30.

In this fixing state, the light emitting diode 1 is fixed by engaging with first through third engaging parts 32 through 34 formed in the housing 30. Details of the first through third engaging parts 32 through 34 are discussed below.

Figure 12:
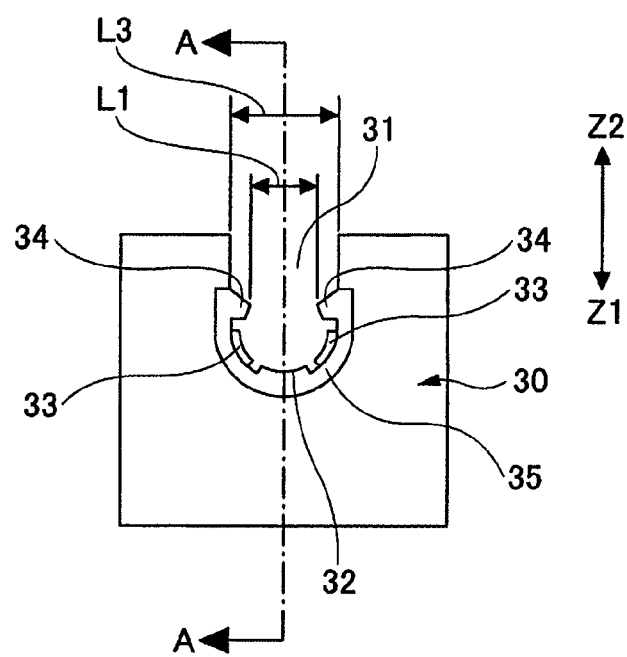
FIG. 12 is a front view of the housing used for the fixing structure of the light emitting diode in the embodiment.
Figure 13:
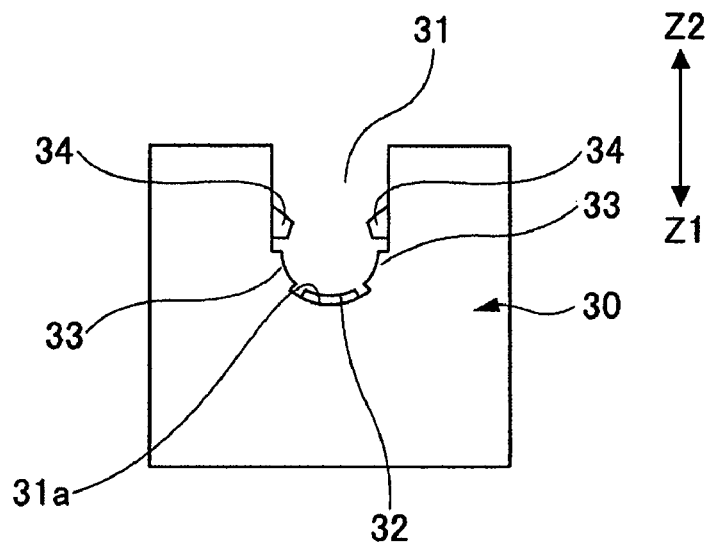
FIG. 13 is a rear view of the housing used for the fixing structure of the light emitting diode in the embodiment.
Figure 14:
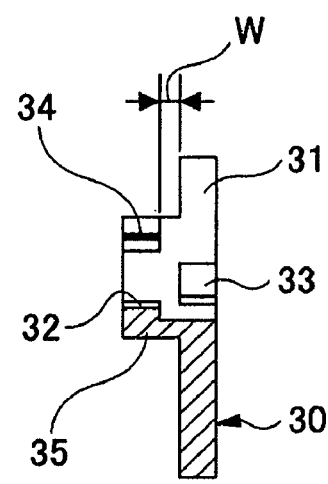
FIG. 14 is a cross-sectional view taken along a line A-A of FIG. 12.

The first engaging part 32 is formed at a lower end part of the U-shaped part 35. The first engaging part 32 projects, as illustrated in FIG. 12 and FIG. 13, from the lower end part 31a of the opening part 31. In addition, the projection height of the first engaging part 32 from the lower end part 31a is the same as the height for engaging the light emitting diode 1 with the surface 3a of the brim part 3 in the state where the light emitting diode 1 is fixed.

Figure 11:
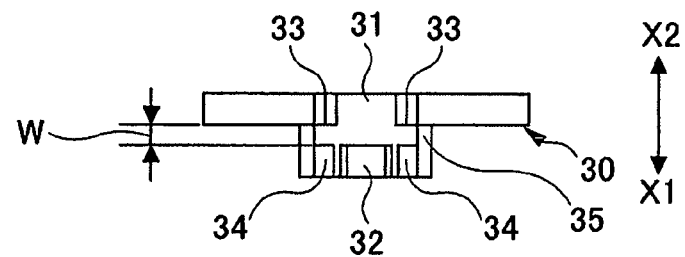
FIG. 11 is a plan view of the housing used for a fixing structure of the light emitting diode in the embodiment.

The second engaging part 33 projects, as illustrated in FIG. 11, to an internal side wall of the opening part 31. A pair of second engaging parts 33 is formed one part 33 on each side position of the first engaging part 32 so as to sandwich the forming position of the first engaging part 32 where the housing 30 is seen in front view as illustrated in FIG. 12. In addition, the projection height of the second engaging part 33 from the internal side wall of the opening part 31 is the same as the height for engaging the light emitting diode 1 with the rear surface 3b of the brim part 3 in the state where the light emitting diode 1 is fixed.

The third engaging parts 34 are formed at left and right end parts of a two-way U-shaped part 35. In other words, two of the third engaging parts 34 are provided so as to face each other. In addition, the third engaging parts 34 have a claw-shaped configuration. The third engaging parts 34 project inside the opening part 31, as illustrated in FIG. 12 where the housing 30 is seen in front view. The relationship among a length L1 between the third engaging parts 34 (see FIG. 12), a diameter L2 of the light emitting part 2 of the light emitting diode 1 (see FIG. 9), and a width L3 of the opening part 31 (see FIG. 12) is as follows. L1<L2, L3

Therefore, in the state where the light emitting diode 1 is fixed to the housing 30, the third engaging parts 34 are engaged with the light emitting part 2 of the light emitting diode 1 so that it is possible to prevent the light emitting diode 1 from being detached in a direction opposite to the fixing direction (namely a direction indicated by an arrow Z2). At this time, the first engaging part 32 comes in contact with the fixing direction side of the light emitting part 2, namely a lower side surface in FIG. 9, and thereby the light emitting diode 1 is supported by the first engaging part 32.

Figure 15:
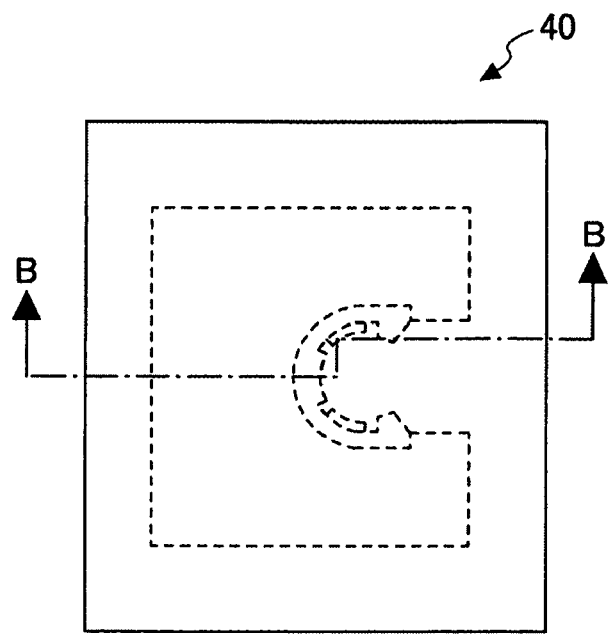
FIG. 15 is a plan view of a mold configured to manufacture the housing used for the fixing structure of the light emitting diode in the embodiment.
Figure 16:
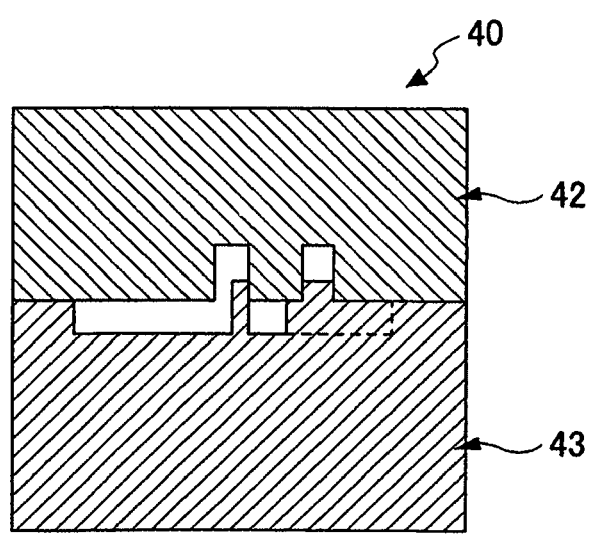
FIG. 16 is a cross-sectional view taken along a line B-B of FIG. 15.

The above-mentioned first through third engaging parts 32 through 34 and the U-shaped part 35 are formed in a body at the time when the housing 30 is molded by using a mold 40 (see FIG. 15 and FIG. 16).

Next, steps of fixing the light emitting diode 1 to the housing 30 are discussed.

In order to fix the light emitting diode 1 to the housing 30, first, the light emitting diode 1 is inserted into the opening part 31 in an inserting direction. Then, the light emitting diode 1 is moved in the fixing direction. At this time, under the conditions where the light emitting part 2 of the light emitting diode 1 faces the third engaging parts 34 and the brim part 3 faces a separation part between the first engaging part 32 and the second engaging part 33 (a part indicated by an arrow W in FIG. 11 and FIG. 14), the light emitting diode 1 is moved in the fixing direction.

As discussed above, the separation length between the third engaging parts 34 is shorter than the diameter L2 of the light emitting part 2 (L1<L2). Accordingly, the light emitting part comes in contact with the third engaging parts 34 by movement of the light emitting diode 1 in the fixing direction. When the light emitting diode 1 is further moved, the light emitting diode 2 pushes and extends the third engaging parts 34 so as to move in the fixing direction.

The housing 30 is made by molding an elastically deformable resin material. Therefore, the housing 30 is elastically deformed by the light emitting part 2 pushing and extending the third engaging parts 34. As a result of this, the light emitting part 2 gets over the third engaging parts 34 so as to move in a fixing position where the light emitting part 2 comes in contact with the first engaging part 32.

In this state, the surface at the fixing direction side (lower side) of the light emitting part 2 is engaged with the first engaging part 32 so as to be supported. Left and right shoulder parts of a side (upper side) opposite to the fixing direction side of the light emitting part 2 are engaged with the third engaging parts 34 so as to be supported. In addition, the brim part 3 is engaged in the separation part W between the first engaging part 32 and the second engaging part 33. The surface 3a of the brim part 3 is engaged with the first engaging part 32. The rear surface 3b is engaged with the second engaging part 33.

Thus, by engaging the first through third engaging parts 32 through 34 with the light emitting diode 1, the light emitting diode 1 is fixed to the housing 30 (hereinafter "fixing state"). In this fixing state, detachment of the light emitting diode from the housing 30 in the directions indicated by the arrows X1 and X2 is limited by engagement of the brim part 3 with the first engaging part 32, the second engaging parts 33, and the third engaging parts 34. In addition, the detachment of the light emitting diode 1 from the housing 30 in the direction indicated by the arrows Z1 and Z2 is limited by engagement of the third engaging parts 34 with the light emitting part 2.

Thus, according to the fixing structure of this embodiment, the light emitting diode 1 can be securely fixed to the housing 30. It is also possible to prevent the light emitting diode 1 from being detached from the housing 30. In addition, in the fixing structure of the embodiment, when the light emitting diode 1 is fixed to the fixing position engaging the first through third engaging parts 32 through 34, the housing 30 is elastically deformed so that movement of the light emitting diode 1 to the fixing position is permitted. Because of this, it is possible to reduce applied loads and the amount of deformation of the first through third engaging parts 32 through 34 at the time of a fixing process.

More specifically, as discussed with reference to FIG. 3 through FIG. 8, in the related art examples, only the arm parts 14 and 23 extending long are elastically deformed at the time when the light emitting diode 1 is fixed. Therefore, in the related art, a stress is concentrated on the bases of the arm parts 14 and 23 so that the arm parts 14 and 23 may be damaged (broken).

On the other hand, in the fixing structure of the above-discussed embodiment, the first through third engaging parts 32 through 34 do not project from the housing 30 very much. The first through third engaging parts 32 through 34 project only several millimeters such as approximately 0.3 mm through approximately 1.5 mm. Because of this, almost no elastic deformation of the first through third engaging parts 32 through 34 occurs. The opening part 31 is deformed by the deformation of the entire housing 30 and thereby entry of the light emitting diode 1 to the fixing position is permitted. As a result of this, it is possible to prevent damage (breakage) of the first through third engaging parts 32 through 34 so that reliability of the fixing structure can be improved.

Because of this, in this embodiment compared to the related art structure, it is possible to decrease the likelihood of damage (breakage) or degradation of the housing 30 where the light emitting diode 1 is fixed. Therefore, it is possible to prevent generation of bad products at the time when the light emitting diode 1 is fixed. In addition, it is possible to avoid the generation of accidents where the light emitting diode 1 is removed at the time of shipment or transportation without knowing the (breakage) or degradation condition of the housing 30. Furthermore, it is possible to decrease the likelihood of the housing 30 being damaged (broken) at the time of maintenance or exchange of the light emitting diode 1. Hence, it is possible to reduce the number of accidents where the housing 30 should be exchanged together with the light emitting diode 1.

FIG. 15 and FIG. 16 show an example of the mold 40 used for molding the housing 30. FIG. 15 is a front view of the mold 40. FIG. 16 is a cross section taken along a line B-B of FIG. 15.

As discussed above, in this embodiment, where the housing 30 is seen in front view, a pair of the second engaging parts 33 is formed one part 33 at each side position of the first engaging part 32 so as to sandwich the forming position of the first engaging part 32. In addition, the third engaging parts 34 are position in the Z2 direction side of the second engaging parts 33. In other words, in this embodiment, the first through third engaging parts 32 through 34 do not overlap each other when the opening part 31 is seen in front view. Because of this, it is possible to mold the housing 30 by only an upper mold 42 and a lower mold 43 without using a slide core. Hence, it is possible to prevent an increase of cost for molding.

In the above-discussed embodiment, the first engaging part 32 engages the surface 3a of the brim part 3 and the second engaging parts 33 engage the rear surface 3b of the brim part 3. However, the first engaging part 32 may engage the rear surface 3b of the brim part 3 and the second engage parts 33 may engage the surface 3a of the brim part 3.

According to the embodiments, when the light emitting diode is fixed to a fixing position engaging the first through third engaging parts, the fixing plate is elastically deformed. Therefore, entry of the light emitting diode to the fixing position is permitted. Therefore, it is possible to reduce applied loads and the amount of deformation of the first through third engaging parts at the time of a fixing process. Because of this, it is possible to prevent damage (breakage) of the first through third engaging parts so that reliability of the fixing structure can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority or inferiority of the invention. Although the embodiments of the present invention have been described in detail, it should be understood that various changes, substitutions, and alterations could be made hereto without departing from the spirit and scope of the invention.

What is claimed is:

1. A fixing structure of a light emitting diode where the light emitting diode is fixed to a fixing plate, the light emitting diode including a light emitting part and a brim part provided at an end part of the light emitting part and having a cannon-ball-shaped configuration, the fixing structure comprising:
   an opening part formed in the fixing plate, the opening part being where the light emitting diode is inserted and extending in a fixing direction perpendicular to an inserting direction;
   a first engaging part configured to engage one of a surface and a rear surface of the brim part in a state where the light emitting diode is fixed;
   a second engaging part configured to engage another one of the surface and the rear surface of the brim part in the state where the light emitting diode is fixed; and
   a third engaging part configured to engage the light emitting part of the light emitting diode in the state where the light emitting diode is fixed so that detachment of the light emitting diode in a direction opposite to the fixing direction is prevented,
   wherein a U-shaped part is formed at the fixing plate so as to project along the opening part;
   the first engaging part is formed at a curved bottom part of the U-shaped part in a body; and
   the third engaging part is formed at both end parts of the U-shaped part in a body, and
   in a case where the light emitting diode is being fixed in a fixing position engaging the first through third engaging parts, the fixing plate is elastically deformed so that an entry of the light emitting diode into the fixing position is permitted.

2. The fixing structure of the light emitting diode as claimed in claim 1,
wherein the third engaging part has a claw-shaped configuration and projects inside the opening part.

3. The fixing structure of the light emitting diode as claimed in claim 1,
wherein two of the third engaging parts are provided so as to face each other.

4. The fixing structure of the light emitting diode as claimed in claim 1,
wherein the first engaging part, the second engaging part and the third engaging part are formed so as to not be overlapped where the opening part is seen in front view.

5. The fixing structure of the light emitting diode as claimed in claim 1,
wherein the first engaging part is configured to comes in contact with the fixing direction side of the light emitting part so as to support the light emitting diode.

6. The fixing structure of the light emitting diode as claimed in claim 1,
wherein the fixing plate is a resin molded article; and
the first through third engaging parts are molded in a body with the molded fixing plate.

7. The fixing structure of the light emitting diode as claimed in claim 1,
wherein a radius of an end part of the opening part has the same length as a radius of the brim part.

8. An electronic apparatus having a fixing structure where a light emitting diode is fixed to a fixing plate, the light emitting diode including a light emitting part and a brim part provided at an end part of the light emitting part and having a cannonball-shaped configuration, the fixing structure, including:
an opening part formed in the fixing plate, the opening part being where the light emitting diode is inserted and extending in a fixing direction perpendicular to an inserting direction;
a first engaging part configured to engage one of a surface and a rear surface of the brim part in a state where the light emitting diode is fixed;
a second engaging part configured to engage another one of the surface and the rear surface of the brim part in the state where the light emitting diode is fixed; and
a third engaging part configured to engage the light emitting part of the light emitting diode in the state where the light emitting diode is fixed so that detachment of the light emitting diode in a direction opposite to the fixing direction is prevented,
wherein a U-shaped part is formed at the fixing date so as to project along the opening part;
the first engaging part is formed at a curved bottom part of the U-shaped part in a body; and
the third engaging part is formed at both end parts of the U-shaped part in a body, and
in a case where the light emitting diode is being fixed in a fixing position engaging the first through third engaging parts, the fixing plate is elastically deformed so that an entry of the light emitting diode into the fixing position is permitted.

9. The electronic apparatus as claimed in claim 8,
wherein the third engaging part has a claw-shaped configuration and projects inside the opening part.

10. The electronic apparatus as claimed in claim 8,
wherein two of the third engaging parts are provided so as to face each other.

11. The electronic apparatus as claimed in claim 8,
wherein the first engaging part, the second engaging part and the third engaging part are formed so as to not be overlapped where the opening part is seen in front view.

12. The electronic apparatus as claimed in claim 8,
wherein the first engaging part is configured to comes in contact with the fixing direction side of the light emitting part so as to support the light emitting diode.

13. The electronic apparatus as claimed in claim 8,
wherein the fixing plate is a resin molded article; and
the first through third engaging parts are molded in a body with the molded fixing plate.

14. The electronic apparatus as claimed in claim 8,
wherein a radius of an end part of the opening part has the same length as a radius of the brim part.

15. A fixing structure of a light emitting diode where the light emitting diode is fixed to a fixing plate, the light emitting diode including a light emitting part and a brim part provided at an end part of the light emitting part and having a cannonball-shaped configuration, the fixing structure comprising:
an opening part having a substantially U-shaped configuration and being formed in the fixing plate, the opening part being where the light emitting diode is inserted in an inserting direction perpendicular to the fixing plate and is moved in a fixing direction perpendicular to the inserting direction and towards a curved configuration in the substantially U-shaped configuration and extending in a fixing direction perpendicular to an inserting direction;
a first engaging part configured to engage one of a surface and a rear surface of the brim part in a state where the light emitting diode is fixed;
a second engaging part configured to engage another one of the surface and the rear surface of the brim part in the state where the light emitting diode is fixed; and
a third engaging part configured to engage the light emitting part of the light emitting diode in the state where the light emitting diode is fixed so that detachment of the light emitting diode in a direction opposite to the fixing direction is prevented,
wherein, in a case where the light emitting diode is being fixed in a fixing position engaging the first through third engaging parts, the fixing plate is elastically deformed so that an entry of the light emitting diode into the fixing position is permitted.

* * * * *

UNITED STATES PATENT AND TRADEMARK OFFICE
CERTIFICATE OF CORRECTION

PATENT NO.         : 8,029,171 B2                                      Page 1 of 1
APPLICATION NO.    : 12/453315
DATED              : October 4, 2011
INVENTOR(S)        : Norimichi Furuta It is certified that error appears in the above-identified patent and that said Letters Patent is hereby corrected as shown below:

Title page, insert the following:

--(63) Related U.S. Application Data: Continuation of Application No. PCT/JP2007/053196, filed on February 21, 2007.--.

Signed and Sealed this
Twenty-second Day of November, 2011

David J. Kappos
*Director of the United States Patent and Trademark Office*